US011117346B2

(12) United States Patent
Cordatos et al.

(10) Patent No.: US 11,117,346 B2
(45) Date of Patent: Sep. 14, 2021

(54) THERMALLY-CONDUCTIVE POLYMER AND COMPONENTS

(71) Applicant: Hamilton Sundstrand Corporation, Charlotte, NC (US)

(72) Inventors: Haralambos Cordatos, Colchester, CT (US); Georgios S. Zafiris, Glastonbury, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 103 days.

(21) Appl. No.: 16/515,772

(22) Filed: Jul. 18, 2019

(65) Prior Publication Data

US 2021/0016542 A1 Jan. 21, 2021

(51) Int. Cl.
*B32B 7/027* (2019.01)
*B32B 5/18* (2006.01)
*B32B 18/00* (2006.01)

(52) U.S. Cl.
CPC ............... *B32B 7/027* (2019.01); *B32B 5/18* (2013.01); *B32B 18/00* (2013.01); *B32B 2255/10* (2013.01); *B32B 2255/205* (2013.01); *B32B 2260/02* (2013.01); *B32B 2260/04* (2013.01); *B32B 2266/06* (2013.01); *B32B 2307/302* (2013.01)

(58) Field of Classification Search
CPC . B32B 5/18; B32B 2255/205; B32B 2255/10; B32B 2266/06; B32B 2260/04; B32B 2307/302
See application file for complete search history.

(56) References Cited

U.S. PATENT DOCUMENTS

| 6,887,408 B2 | 5/2005 | Yuan |
| 9,376,750 B2 | 6/2016 | George et al. |
| 2007/0284095 A1 | 12/2007 | Wang et al. |
| 2012/0160095 A1 | 6/2012 | Gin et al. |

(Continued)

FOREIGN PATENT DOCUMENTS

DE  102007048013 A1  4/2009

OTHER PUBLICATIONS

Extended European Search Report for EP Application No. 19213107.6, dated Jun. 29, 2020, pp. 7.

(Continued)

*Primary Examiner* — Hai Vo
(74) *Attorney, Agent, or Firm* — Kinney & Lange, P. A.

(57) ABSTRACT

A method of forming a component includes depositing a ceramic material within an open-cell void of a polymer body. The ceramic material deposited around the periphery of the open-cell void structure forms a thermally-conductive path through the polymer body. The ceramic material circumscribes an open volume extending the entire length of the thermally-conductive path that is filled with a sealant such that fluids are incommunicable from the first surface to the second surface via the thermally-conductive path. A method of forming a heat exchanger includes forming a plurality of plates, each plate formed as a thermally-conductive polymer body. The method of forming the heat exchanger further includes arranging the plurality of plates within a housing to form a plate and frame heat exchanger configured to place a first flowpath in a heat exchange relationship with a second flowpath.

18 Claims, 3 Drawing Sheets

(56) References Cited

U.S. PATENT DOCUMENTS

| | | |
|---|---|---|
| 2015/0118544 A1 | 4/2015 | Oukassi |
| 2015/0213920 A1* | 7/2015 | Lee .................. B32B 15/046 |
| | | 428/71 |
| 2015/0359134 A1* | 12/2015 | Soong ................ H05K 7/2039 |
| | | 361/720 |
| 2016/0263791 A1 | 9/2016 | Uibel et al. |
| 2017/0162855 A1 | 6/2017 | Kim et al. |
| 2017/0284612 A1 | 10/2017 | Zhang et al. |
| 2018/0005917 A1* | 1/2018 | Tang ................... H01L 23/3736 |
| 2019/0107343 A1 | 4/2019 | Alahyari et al. |

OTHER PUBLICATIONS

Gaskins et al., "Review-Investigation and Review of the Thermal, Mechanical, Electrical, Optical, and Structural Properties of Atomic Layer Deposited High-k Dielectrics: Beryllium Oxide, Aluminum Oxide, Hafnium Oxide, and Aluminum Nitride," ECS Journal of Solid State Science and Technology, 6 (10) N189-N208 (2017).

Kelkar et al., "Evaluation of Vapor Deposition Techniques for Membrane Pore Size Modification," Journal of Membrane Science and Research 3 (2017) 64-70.

Tarala et al, "Growing Aluminum Nitride Films by Plasma-Enhanced Atomic Layer Deposition at low temperatures," Journal of Physics: Conference Series 652 (2015) pp. 7.

* cited by examiner

THERMALLY-CONDUCTIVE POLYMER AND COMPONENTS

BACKGROUND

This disclosure relates generally to methods of making thermally-conductive polymer components and, more particularly, relates to assemblies that utilize thermally-conductive polymer components.

Current methods of producing thermally-conductive polymer materials generally involve blending filler materials into a polymer prior to molding. To improve the thermal conductivity of the polymer, the filler material selection involves identifying a material with higher thermal conductivity than the polymer. During the molding process, extrusion or injection-molding, or additive or 3D printing of the polymer causes the filler materials to align with an extrusion direction, or injection direction, or printing direction, which generally causes individual filler particles (e.g., platelets, nanofibers, or nanoribbons) to be orientated parallel to exterior surfaces of the polymer body rather than a transverse orientation of the polymer body. This orientation of the filler materials limits thermal conductivity along the transverse or through-thickness dimension of the polymer. Moreover, typical methods of producing thermally-conductive polymer materials produce disconnected filler particles completely encapsulated by the polymer matrix. Discontinuity in the filler particles along the transverse dimension reduces thermal conductivity of the polymer due to inefficient thermal transfer at the boundaries between the filler particles and polymer matrix.

Further, casting ceramic materials to form polymers that are thermally conductive along the transverse dimension involves applying ceramic slurry to a preformed polymer body followed by hardening the ceramic material. Ceramics are hardened or cured by raising the temperature of the ceramic material to its annealing temperature. However, the annealing temperature of some ceramic materials often exceeds the temperature capability of the polymer body, thus deforming or otherwise rendering the polymer body unsuitable for its intended purpose.

SUMMARY

In one example, a method of forming a component comprises depositing a ceramic material within an open-cell void of a polymer body. The ceramic material forms a thermally-conductive path from a first surface of the polymer body to a second surface of the polymer body. Depositing the ceramic material comprises depositing the ceramic material around the periphery of the conductive path using atomic layer deposition to form an open volume circumscribed by the ceramic material that extends along the entire thermally-conductive path. The method further comprises filling the open volume with a sealant.

In another example, a method of forming a plate and frame heat exchanger comprises forming a plurality of plates according to the foregoing method of forming a component and attaching the plurality of heat-exchanging plates to a heat exchanger housing. The plurality of plates are arranged to define a first flowpath of a first fluid and a second flowpath of a second fluid. The first flowpath and second flowpath are separated by the plurality of plates and each of the plurality of heat-exchanging plates contacts the first flowpath and the second flowpath.

In a further example, a heat-exchanging plate comprises a polymer plate containing a network of open-cell voids, a ceramic material disposed within the network of open-cell voids, and a sealant disposed within an open volume. The network of open-cell voids extends from a first heat-exchanging surface of the polymer plate to a second heat-exchanging surface of the polymer plate. The ceramic material forms a plurality of thermally-conductive paths that extend from the first heat-exchanging surface to the second heat-exchanging surface. Each of the plurality of thermally-conductive paths defines the open volume, which is circumscribed by the ceramic material and extends along the entire length of the each of the plurality of thermally-conductive paths. The sealant fills the open volume to prevent fluid communication between the first heat-exchanging surface and the second heat-exchanging surface.

DETAILED DESCRIPTION

Figure 1:
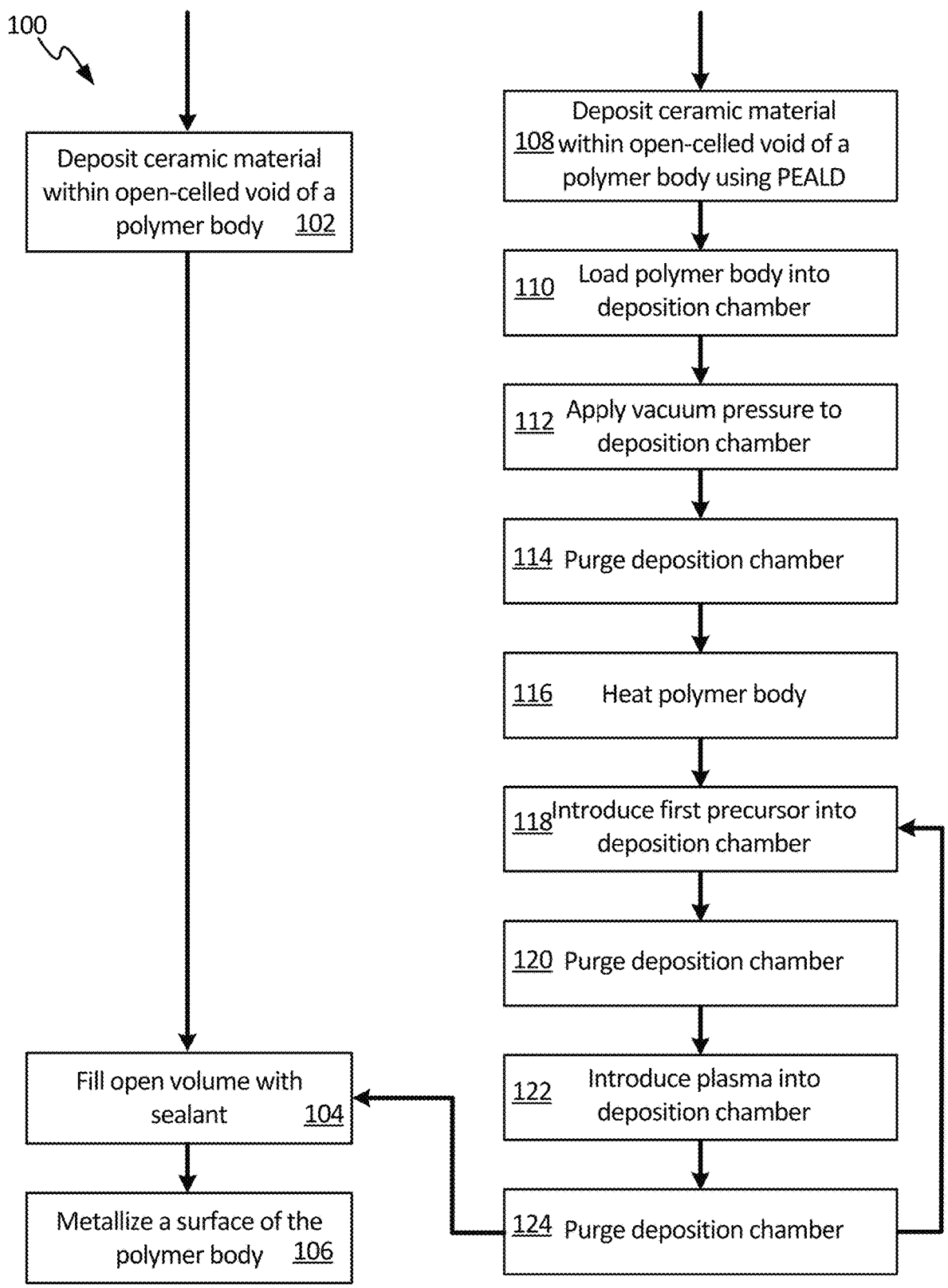
FIG. 1 is a flow diagram of an exemplary method of making a thermally-conductive polymer component.

The present disclosure relates to methods of producing thermally-conductive polymer components that include depositing a ceramic material within an open-cell void to form a thermally-conductive ceramic path extending between surfaces of the polymer body. The method further includes depositing the ceramic material in such a way that the ceramic material circumscribes an open volume and filling the open volume with a sealant. Depositing the ceramic material can be performed by any method that allows thermally-conductive channels to be formed within open-cell voids of the polymer body, for example, atomic layer deposition (ALD) or plasma-enhanced atomic layer deposition (PEALD). Advantageously, the thermally-conductive paths constructed by these techniques form a continuous layer of ceramic material oriented along a transverse dimension of the polymer body rather than a layer of disconnected filler particles interspersed within a relatively low thermal-conductivity polymer matrix. As such, the thermally-conductive channels provide more-effective heat transfer paths in the transverse, or through-thickness, dimension of the polymer body than can be achieved by conventional methods.

In some examples, the thermally-conductive polymer component forms a component of a plate and frame heat exchanger utilized in an aircraft, which rejects heat loads from lubricating oil, fuel, hydraulic fluid, or other fluids. In some prior applications, conventional aircraft heat exchanger designs utilize aluminum plates arranged in a plate and frame heat exchanger in order to prevent engine overheating. However, the use of aluminum plates rather than a lighter alternative increases an aircraft's overall weight and thereby reduces fuel consumption efficiency of the engine and the potential range of the aircraft. Additionally, aluminum is prone to corrosion and special measures such as application of corrosion inhibitive coatings and surface treatments need to be employed, increasing its cost with, in some cases, a limited effect on service life extension compared to polymeric materials. Advantageously, thermally-conductive polymer heat-exchanging plates produced by the method disclosed herein weigh less than conventional aluminum plates, can be made in a wider variety of shapes and designs than conventional aluminum plates, and are not prone to corrosion. Further, thermally-conductive polymer heat-exchanging plates produced by the method disclosed herein have better thermal transfer characteristics than thermally-conductive polymer plates produced using conventional methods. These thermally-conductive polymer plates can be used to form a variety of plate and frame heat exchanger configurations including parallel-flow, cross-flow, or combined arrangements of parallel-flow and cross-flow.

As used herein, the "transverse dimension" of a polymer body refers to the dimension along a path of heat flux flowing between one of the first and second surfaces of the polymer body to the other of the first and second surfaces of the polymer body. When the polymer body takes the form of a plate, the "transverse dimension" refers to the through-thickness dimension of the plate. Some polymer bodies may have more than two surfaces utilized for heat transfer. For these polymer bodies, the "transverse dimension" refers to the heat flux path flowing between any two surfaces of the polymer body. The following exemplary embodiment describes advantages of thermally-conductive polymer bodies by referring to two surfaces of the polymer body. However, it will be appreciated that aspects of the following method could be applied to polymer bodies with any number of surfaces.

FIG. 1 is a flow diagram describing a method of making a polymer component with enhanced thermally-conductivity. In general, method 100 includes depositing a ceramic material within an open-cell void of a polymer body to define a thermally-conductive path circumscribing an open volume. The thermally-conductive path and open volume extend from a first surface of the polymer body to a second surface of the polymer body. Method 100 further includes filling the open volume with a sealant material such that fluids are incommunicable from the first surface to the second surface along the thermally-conductive path. Additionally, method 100 may include depositing a metallic layer onto the first surface, the second surface, or a both first and second surfaces of the polymer body to further enhance thermal-conductivity through the polymer body.

Polymer bodies suitable for method 100 have an open-cell porosity defined by one or more open-cell voids. At least some of the open-cell voids and, in some instances, all of the open-cell voids form continuous paths from the first surface of the polymer body to the second surface of the polymer body. When the polymer body contains more than one open-cell void, the open-cell voids may be connected to form a network of voids within the polymer body, the void network having a branched or dendritic structure. In other examples, each void path of the open-cell porosity may be discrete from all of the other voids such that respective voids are not connected and do not intersect within the polymer body. In still other examples, some of the voids may be partially connected such that some of the open-cell voids form a void network within the polymer body and some of the open-cell voids are discrete from the remaining voids.

The polymer body is shaped to transfer heat from at least the first surface of the polymer body to the second surface of the polymer body. Although in some examples, the polymer body transfers heat among multiple polymer body surfaces. One or more of the surfaces of the polymer body can be substantially flat or planar in some examples. In other examples, one or more of the surfaces has a curved shape. In still other examples, the surfaces of the polymer body can include flat and curved surfaces. When the polymer body is a plate, the surfaces may be surfaces on opposite sides of a rectilinear plate.

Typically, but not exclusively, a thermoplastic polymer, such as a polyaryl ether ketone material (PAEK) or polyether ether ketone (PEEK), is selected to obtain sufficient temperature capacity for use in method 100. In other examples, other polymers can be used depending on the maximum process temperature achieved during deposition, such as polyetherimides (PEI), polyimides (PI), polysulfones (PSU), polyphenylsulfones (PPSU), polyphenylsulfides (PPS) and polyvinylidene fluoride (PVDF) families of polymers. In other examples, thermoset polymers can be used. Some polymer materials may have an open-cell porosity as a result of the casting process. In other instances, the polymer material may be combined with a sacrificial material, for example a polyimide, prior to forming the polymer body. In these instances, the open-cell porosity can be created by voids that remain after removing the sacrificial material via etching, heating, leaching, or other compatible removal process.

Once a suitable open-cell polymer body is selected, ceramic material is deposited within an open-cell void of the polymer body in step 102 of method 100. By virtue of the open-cell void structure, the deposited ceramic material forms a continuous thermally-conductive path extending from at least the first surface of the polymer body to the at least the second surface of the polymer body. Advantageously, this structure allows for the polymer body to conduct heat along the transverse dimension of the polymer body from the first surface to the second surface. Suitable ceramic materials for this process include boron nitride, aluminum nitride, or a combination of boron nitride and aluminum nitride, although other ceramic materials, such as silicon carbide, could be used depending on the temperature capacity of the polymer body.

Where conventional processes for manufacturing thermally-conductive ceramic-polymer bodies completely fill open cell porosity with a ceramic slurry or ceramic filler particles encapsulated by a polymer matrix, the thermally-conductive path formed by methods of this disclosure deposit ceramic material along the periphery of the open-cell void of the polymer body. Depositing ceramic material around the periphery of the open cell void structure in a layer-by-layer fashion permits the ceramic material, and hence the thermally-conductive path, to conform to the boundary of the open cell void. Successive deposition steps thus grow the deposited ceramic material until a target thickness of the ceramic material forms around the boundary of the open-cell void. The target thickness is sufficiently small such that an open volume remains that is circumscribed by the ceramic material.

In some examples, the ceramic material has a similar shape to the periphery of the open-cell void and extends at a uniform thickness or substantially uniform thickness toward the center of a cross-sectional slice of the open-cell void. In other examples, the ceramic material has a shape that is different from the periphery of the open-cell void such that it extends at a non-uniform thickness toward the center of a cross-sectional slice of the open-cell void. In still other examples, the thickness of the ceramic material at any point along the open-cell void varies as a function of a distance from the first surface or the second surface. In each case, the open volume extends along the entire length of the thermally conductive path from the first surface of the polymer body to the second surface of the polymer body, and the ceramic material is deposited such that there is an open volume circumscribed by the thermally-conductive path at any cross-sectional slice of the open cell void.

While the ceramic material can be deposited within the open cell void of the polymer body using any suitable technique, one suitable method of depositing the ceramic material uses atomic layer deposition (ALD). As applied to method 100, atomic layer deposition techniques include alternating steps of exposing the polymer body (i.e., substrate) to a first precursor and exposing the polymer body to a second precursor within a deposition chamber (sometimes referred to as a reactor). Each precursor is a gas selected to be chemically reactive with the polymer body as well as with other precursor gases used during the deposition process. For example, the first precursor can be a ceramic precursor and the second precursor can be a substance suitable for reacting with a ceramic precursor to thereby form a layer of ceramic material on the polymer body. The precursors are introduced to the porous polymer material sequentially, in a form of non-overlapping pulses. In each pulse the precursor molecules react with exposed surfaces of the polymer body in a self-limiting way, terminating once all reactive sites on the exposed surfaces are consumed. The maximum amount of material deposited on the substrate surface after each pulse is therefore limited and controlled by the nature of the interactions between the precursor chemicals and the polymer substrate surface. Following this method, a uniform thickness or a substantially uniform thickness of the ceramic material can be deposited onto the full length of all exposed surfaces that are accessible to the precursor gases, including exposed surfaces of the open-cell void or voids, regardless of the tortuosity, path, or shape complexity of the open-cell voids. More specifically, after the polymer body is placed within a deposition chamber, the chamber is purged with an inert gas, for example, nitrogen. While maintaining the inert atmosphere within the deposition chamber, the polymer body is heated to a preselected process temperature. The preselected process temperature is selected based on the temperature necessary to induce a reaction among the precursor materials and the polymer body and the temperature capability of the polymer material. Next, introduction of the first precursor into the deposition chamber causes molecules of the first precursor to diffuse into exposed surfaces of the polymer body, including exposed surfaces of the open-cell void or voids. After a period of time elapses and before the introduction of the second precursor gas, the deposition chamber is vented to remove excess first precursor gas. Introduction of the second precursor gas while the polymer body is held at the preselected process temperature causes molecules of the second precursor gas to react chemically with molecules of the first precursor gas along exposed surfaces of the polymer body and open-cell void or voids. As a result of the chemical reaction, a deposition layer forms along exposed surfaces of the polymer body and open-cell void or voids and is a product of the first and second precursor gases. Thereafter, purging the second precursor gas with an inert gas completes a deposition step and prepares the deposition chamber for a subsequent deposition step. Repeated and sequential exposure of the polymer body to the first and second precursor gases produces successive deposition layers. In this manner, a thermally-conductive path can be formed from a first surface of the polymer body to a second surface of the polymer body. The thickness of the ceramic material within the open-cell void can be controlled by varying the number of deposition steps performed.

Alternating steps of exposing the polymer body to a ceramic precursor and exposing the polymer body to a reacting precursor continue until a target thickness of ceramic material forms within the open-cell voids of the polymer body. Since no cross-sectional slice of the open cell void is completely filled with ceramic material, an open volume exists within the open-cell void of the polymer body that is circumscribed by the thermally-conductive path. This open volume extends the entire length of the thermally-conductive path from the first surface to the second surface of the polymer body.

Filling the open volume with a sealant occurs in step 104 of method 100 and is performed after repeated deposition steps produce a thermally-conductive path in step 102. The sealant serves to seal and fill the open volume circumscribed by the ceramic material. In some examples, the sealant is a flexible sealant, for example, a silicon-based sealant. In other examples, the sealant could be a metal layer deposited by conventional metal vapor deposition techniques, such as a chemical vapor deposition process or metal vaporization deposition under a vacuum. Advantageously, this prevents fluid communication between the first surface and the second surface of the polymer body. In some examples, the sealant fills the entire void space circumscribed by the ceramic material such that it extends along the entire thermally-conductive path from the first surface to the second surface of the polymer body. In other examples, the sealant only partially fills the void space circumscribed by the ceramic material such that it only extends partially along the thermally-conductive path. In some of these examples, the sealant may be disposed at two or more positions along the thermally-conductive path such that the sealant creates two or more sealant plugs with one or more sealant void spaces between the sealant plugs.

Optionally, after a thermally-conductive ceramic path is formed in step 102 and the open volume is sealed in step 104, a metallic layer can be deposited onto the first and second surfaces of the polymer body in step 106 to enhance thermal-conductivity between a fluid interacting with the first or second surface and the thermally-conductive paths of the polymer body. Metal materials suitable for providing this metallic layer include copper and aluminum, although other metallic materials could be used. Metallizing the polymer body may include applying a metal layer to the first surface of the polymer body, applying a metal layer to the second surface of the polymer body, or applying a metal layer to both the first and second surfaces of the polymer body. The metal layer can be applied using conventional techniques, for example, by using a chemical vapor deposition process or metal vaporization deposition under vacuum.

In some examples, method 100 optionally includes using a vacuum to enhance atomic layer deposition of the ceramic material within the network of open-cell voids. In these examples, atomic layer deposition occurs within a vacuum chamber. Generally, the vacuum chamber has an inlet port capable of flowing a ceramic precursor into the chamber and a vacuum port capable of creating a pressure drop within the vacuum chamber. The polymer body is positioned between the inlet port and the vacuum port such that the pressure drop created by the vacuum port enhances flow of the first and second precursor through the polymer body, enhancing deposition of the ceramic material within the open-cell voids.

In lieu of the atomic layer deposition (ALD) technique described by step 102, plasma-enhanced atomic layer deposition (PEALD) can be used to deposit the ceramic material within open-cell voids of the polymer body as described by step 108 of method 100. Plasma enhanced atomic layer deposition (PEATD) is similar to atomic layer deposition (ALD). However, instead of relying solely on heating the polymer body (or other substrate) to a process temperature for inducing a chemical reaction at exposed surfaces of the polymer body, plasma-enhanced atomic layer deposition utilizes energy imparted by a plasma to produce the requisite chemical reaction. As a consequence, plasma-enhanced atomic layer deposition can be performed at a lower process temperature relative to an analogous atomic layer deposition technique. As with atomic layer deposition, plasma-enhanced atomic layer deposition occurs in a deposition chamber (or reactor) and proceeds in a series of deposition cycles. Each deposition cycle includes steps of exposing the polymer body to a first precursor and exposing the polymer body to a second precursor as with atomic layer deposition. However, with plasma-enhanced atomic layer deposition, either the first precursor or the second precursor is plasma.

Using plasma-enhanced atomic layer deposition to form a thermally-conductive ceramic layer within open-cell voids of the polymer body includes loading the polymer body within a deposition chamber (or reactor) in step 110 and applying a vacuum pressure to the deposition chamber in step 112. Subsequently, while maintaining the vacuum pressure, an inert gas (e.g., nitrogen gas) purges the deposition chamber in step 114, and the polymer body (or other substrate) is heated to a preselected process temperature in step 116. Because one of the precursor materials is plasma, the preselected process temperature can be lower than an analogous atomic layer deposition process. In some examples, plasma-enhanced atomic layer deposition is performed at temperatures ranging from 250° C. to 280° C.

Next, introduction of a first precursor into the deposition chamber in step 118 causes molecules of the first precursor to diffuse into exposed surfaces of the polymer body and open cell voids. In some examples, the ceramic precursor is a gas such as trimethyl aluminum, Tris(dimethyl)amidoboron (TDMAB), or hafnium tetrachloride. After a predetermined time period after which the diffusion of the first precursor molecules into the polymer body falls below a threshold rate, purging the deposition chamber occurs through the introduction of an inert gas to evacuate excess precursor gas in step 120. For example, exposing the polymer body to the ceramic precursor step can have a duration of less than six seconds, and purging the chamber of ceramic precursor can have a duration of 10 seconds. In other examples, the ceramic precursor exposure can have a duration of 10 seconds.

Once the deposition chamber has been purged, step 122 involves introduction of the plasma precursor into the deposition chamber while maintaining the polymer body at the preselected process temperature causes a chemical reaction to occur between molecules of the first precursor and the plasma molecules. In some examples, the plasma may contain a mixture of nitrogen and hydrogen gas. In other examples, the plasma contains oxygen gas. The chemical reaction produces a deposition layer along the exposed surfaces of the polymer body and open-cell void or voids composed of a material that is the product of the chemical reaction. Thereafter, after a preselected time period, purging the plasma from the deposition chamber in step 124 completes a deposition step and prepares the deposition chamber for a subsequent deposition step. In some of these examples, exposing the polymer body with plasma can have a duration of at least 10 seconds. In other of these examples, plasma exposure may have a duration of at least 20 seconds.

Repeated and sequential exposure of the polymer body to the first precursor gas and plasma produces successive deposition layers to form along exposed surfaces of the polymer body and open-cell void. In this manner, a thermally-conductive path that circumscribes an open volume can be formed from a first surface of the polymer body to a second surface of the polymer body.

Figure 2A:
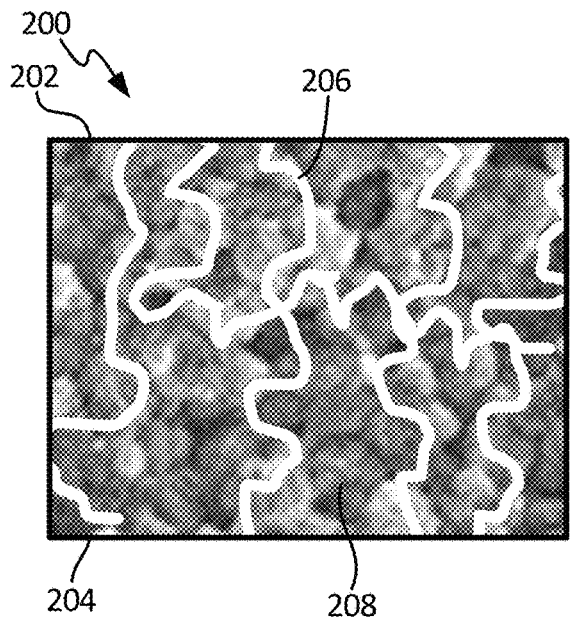
FIG. 2A is a cross-sectional view showing an example of a polymer body that has a network of open-cell voids.

FIG. 2A is a cross-sectional view of a polymer body having a network of open-cell voids. Polymer body 200 has first surface 202, second surface 204, and open-cell voids 206. Open-cell voids 206 form a network of continuous paths from first surface 202 to second surface 204. In the example depicted in FIG. 2A, polymer body 200 is composed of plurality of spherulites 208 and open-cell voids 206 form a network extending through void space within plurality of spherulites 208. In examples where polymer body 200 is a heat-exchanging plate, first surface 202 is a first heat-exchanging surface and second surface 204 is a second heat-exchanging surface. In some examples, polymer body 200 is formed of a thermoplastic material, such as a polyaryl ether ketone (PAEK) material. In some of these examples, the polyaryl ether ketone (PAEK) material may be polyether ether ketone (PEEK).

Figure 2B:
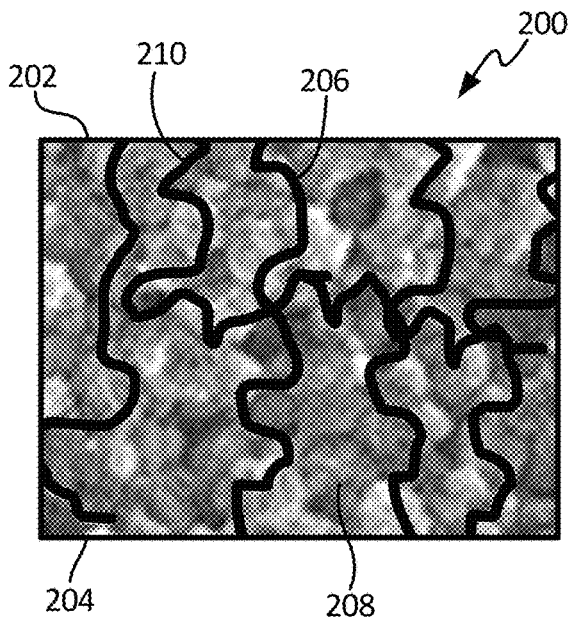
FIG. 2B is a cross-sectional view showing an example of a polymer body that has a network of open-cell voids containing thermally-conductive paths.

FIG. 2B is a cross-sectional view of a polymer body having a network of open-cell voids and containing thermally-conductive paths formed by deposited ceramic material. In FIG. 2B, thermally-conductive path 210 extends from first surface 202 to second surface 204 along the continuous paths of open-cell voids 206. In examples where polymer body is a heat-exchanging plate, thermally conductive path 210 conducts heat from a first heat-exchanging surface to a second heat-exchanging surface. In some examples, thermally-conductive path 210 is formed of a ceramic material. In some examples, the ceramic material may be boron nitride, aluminum nitride, or a combination of boron nitride and aluminum nitride. Generally, thermally-conductive path 210 circumscribes an open volume that extends along the entire length of thermally-conductive path 210.

Figure 2C:
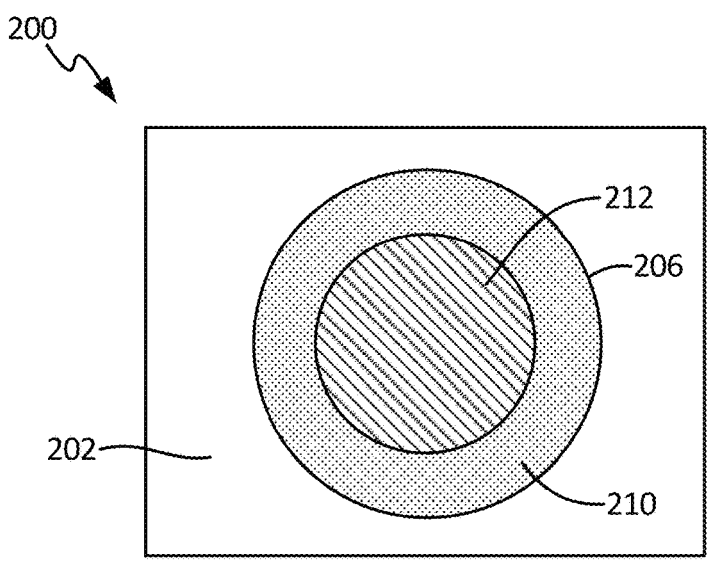
FIG. 2C is a cross-sectional view showing an example of a polymer body that has a network of open-cell voids containing thermally-conductive paths in which the thermally-conductive paths circumscribe an open volume filled with a sealant.

FIG. 2C is a cross-sectional view of a polymer body having a network of open-cell voids containing thermally-conductive paths. In the example depicted in FIG. 2C, the ceramic material forming thermally conductive path 210 is deposited around the periphery of open-cell void 206, and thermally-conductive path 210 circumscribes sealant 212. In the example depicted in FIG. 2C, the ceramic material forming thermally-conductive path 210 extends at a uniform thickness or substantially uniform thickness toward the center open-cell void 206. Sealant 212 fills the open volume formed by deposition of the ceramic material forming thermally-conductive path 210. Sealant 212 functions to prevent fluid communication between first surface 202 and second surface 204, and can be formed of a metal material, such as aluminum or copper, or can be a flexible sealant, such as a silicon-based sealant. In examples where the void circumscribed by thermally-conductive path 210 is filled by sealant 212, sealant 212 may extend partially through thermally-conductive path 210 or may extend through the entire length of thermally-conductive path 210. In examples where sealant 212 does not extend through the entire length of thermally-conductive path 210, sealant 212 may be disposed at two or more positions along thermally-conductive path 210 between first surface 202 and second surface 204 to create two or more sealant plugs along thermally-conductive path 210 with sealant void spaces between the sealant plugs.

Figure 3:
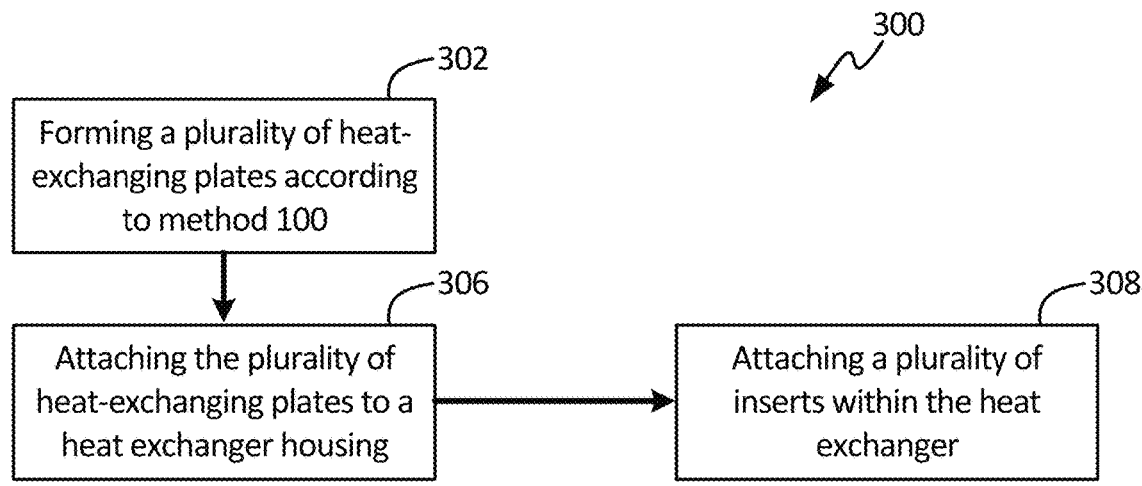
FIG. 3 is a flow diagram describing an example method of making a heat exchanger.

In some examples, the polymer body is a heat-exchanging plate made of a thermally-conductive polymer material produced in accordance with method 100. The heat-exchanging plate may be designed for use in a plate and frame heat exchanger. FIG. 3 is a flow diagram describing method 300, a method of making a heat exchanger using thermally-conductive polymer plates producing using method 100.

Method 300 includes forming heat-exchanging plates according to method 100 in step 302. Generally, the heat-exchanging plates made according to method 100 have a first heat-exchanging surface and a second heat-exchanging surface separated by a thickness. The first heat-exchanging surface and the second-heat exchanging surface are substantially parallel and the thickness is appropriate for heat exchange along the thermally-conductive channels. Generally, the heat-exchanging plates made according to method 100 are of a size and shape appropriate for use in a plate and frame heat exchanger.

In step 306, each heat-exchanging plate is attached to a housing of the heat exchanger. In some examples, attaching the heat-exchanging plates to the heat exchanger housing comprises friction welding the plates to the heat exchanger housing. Generally, friction welding is performed by moving a plate relative to the heat exchanger housing to generate heat through mechanical friction while applying a lateral force to press the plate and the heat exchanger housing toward each other to thereby weld the plate to the heat exchanger housing. Other methods of polymer joining, such as ultrasonic welding, adhesive, melt, and solvent based joining can be also used by attach the heat-exchanging plates to the heat exchanger housing.

The heat-exchanging plates may be disposed within the housing in an arrangement that creates a first flowpath and a second flowpath through the housing. Generally, the first flowpath and the second flowpath comprise a plurality of spaces disposed between the plurality of heat-exchanging plates. In some examples, the first flowpath and second flowpath are disposed within alternating gaps such that each of the plates of the plurality of heat-exchanging plates is in contact with the first flowpath and the second flowpath.

Generally, the first and second flowpaths are capable of receiving one or more fluids. Further, the first and second flowpaths generally are not in fluid communication, such that the fluids flowing through the first and second flowpaths do not mix as they flow across the heat-exchanging plates. The first and second flowpaths can be oriented to be in a cross flow arrangement, a counter flow arrangement, a cocurrent flow arrangement, or a hybrid flow arrangement.

In some examples, the plate and frame heat exchanger can be configured such that oil flows along the first flowpath, such as a lubricating oil, and fuel flows along the second flowpath. In such a configuration, the oil incoming to the heat exchanger may be at a higher temperature than the fuel incoming to the heat exchanger such that the plate and frame heat exchanger functions to cool the oil flowing through the first flowpath and heat fuel flowing through the second flowpath.

In some examples, method 300 optionally includes step 308, which comprises attaching a plurality of inserts within the heat exchanger frame. Generally, the inserts are attached within the first flowpath, the second flowpath, or the first and second flowpaths. The inserts function to create turbulent flow conditions within the first flowpath or second flowpath. Turbulent flow conditions can improve heat transfer between the fluids flowing through the first flowpath and second flowpath. In some examples, the inserts have a corrugated shape. In other examples, the inserts have another shape suitable for creating turbulent flow conditions.

Figure 4:
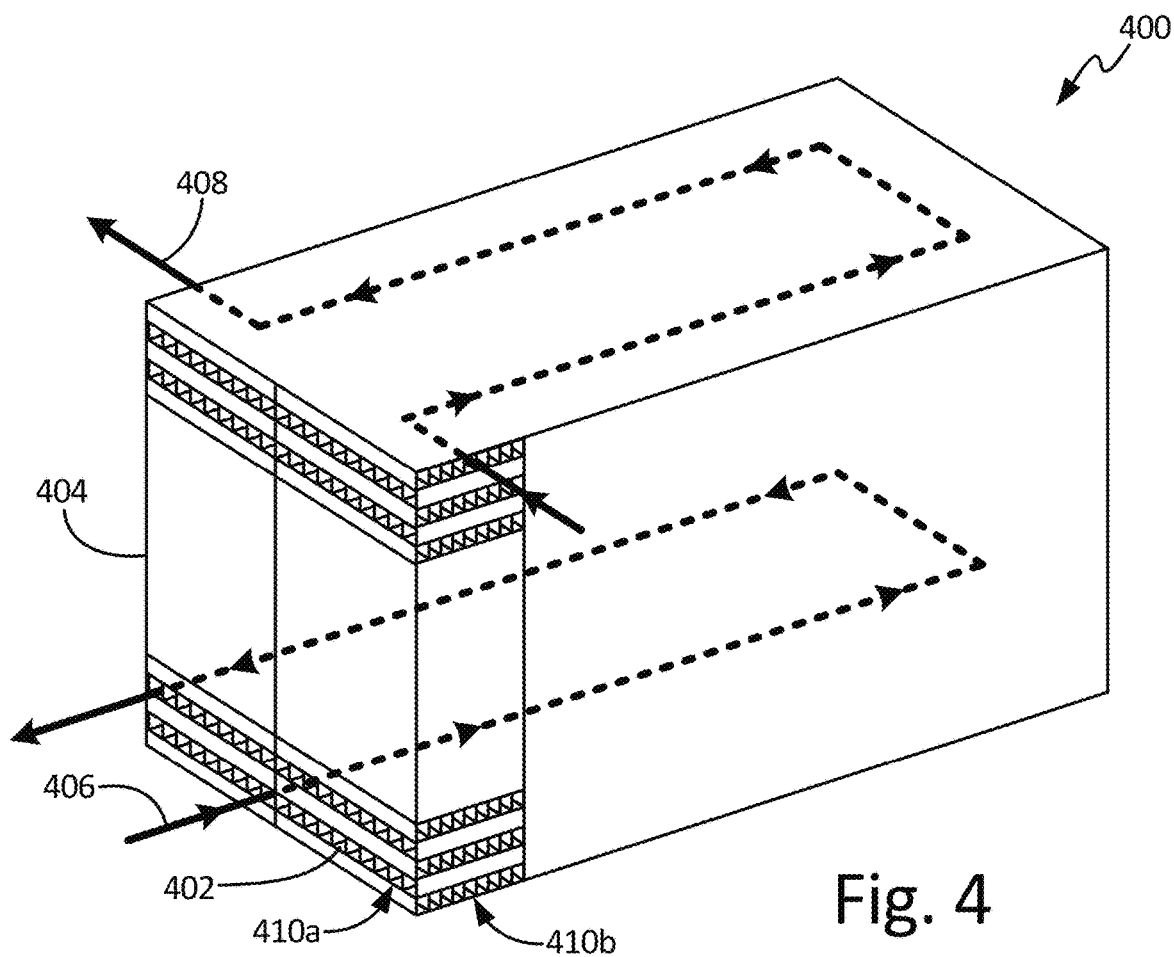
FIG. 4 is a perspective view depicting plate and frame heat exchanger that can be made using the method described by FIG. 3.

FIG. 4 is a perspective view of an example of a plate and frame heat exchanger. Heat exchanger 400 includes a plurality of heat-exchanging plates 402, frame 404, first flowpath 406, second flowpath 408, and inserts 410a-b.

In the example shown in FIG. 4, each of heat-exchanging plates 402 is shown as rectangular solid. In other examples, heat-exchanging plates 402 might have a cylindrical shape or another shape suitable for use in a heat-exchanger. Generally, heat-exchanging plates 402 are disposed within frame 404 such that they create first flowpath 406 and second flowpath 408.

Generally, first flowpath 406 and second flowpath 408 comprise a plurality of spaces disposed between plurality of heat-exchanging plates 402 and are each capable of receiving a fluid flow. In some examples, first flowpath 406 and second flowpath 408 are disposed alternatingly between heat-exchanging plates such that each of the plates of plurality of heat-exchanging plates 402 is in contact with first flowpath 406 and second flowpath 408. In some examples, plurality of heat-exchanging plates 402 might be arranged so that first flowpath 406 and second flowpath 408 have crossflow arrangement, a counter flow arrangement, or a concurrent flow arrangement. In the example depicted in FIG. 4, first flowpath 406 and second flowpath 408 are not in fluid communication.

In some examples, an operational state of heat exchanger 400 includes an oil disposed within first flowpath 406 and a fuel disposed within second flowpath 408. The oil may be, for example, a gas turbine engine oil. The fuel may be, for example, an aircraft fuel. In these examples, the operational state of heat exchanger 400 is configured to cool the oil flowing through first flowpath 406 and heat the fuel disposed within second flowpath 408.

In the example depicted in FIG. 4, inserts 410a are disposed within first flowpath 406 and inserts 410b are disposed within second flowpath 408. Generally, inserts 410a-b function to create turbulent flow conditions within first flowpath 406 and second flowpath 408, respectively. Turbulent flow conditions can improve heat transfer between the fluids flowing through first flowpath 406 and second flowpath 408. In the depicted example, inserts 410a-b and have a corrugated shape. In other examples, any of inserts 410a-b may have another shape suitable for creating turbulent flow conditions.

Discussion of Possible Embodiments

The following are non-exclusive descriptions of possible embodiments of the present invention.

A method of forming a component comprising depositing a ceramic material within an open-cell void of a polymer body, the ceramic material forming a thermally-conductive path from a first surface of the polymer body to a second surface of the polymer body, wherein depositing the ceramic material comprises depositing the ceramic material around the periphery of the conductive path to form an open volume circumscribed by the ceramic material that extends along the entire thermally-conductive path and filling the open volume with a sealant.

The method of forming a component of the preceding paragraph can optionally include, additionally and/or alternatively, any one or more of the following steps, features, configurations and/or additional components:

A further embodiment of the foregoing method of forming a component, wherein depositing the ceramic material around the periphery of the conductive path is performed using atomic layer deposition.

A further embodiment of any of the foregoing methods of forming a component, wherein atomic layer deposition is plasma-enhanced atomic layer deposition.

A further embodiment of any of the foregoing methods of forming a component, wherein plasma-enhanced atomic layer deposition is performed in a reactor.

A further embodiment of any of the foregoing methods of forming a component, wherein the reactor is held at a temperature between 250° C. and 280° C.

A further embodiment of any of the foregoing methods of forming a component, wherein plasma-enhanced atomic layer deposition comprises flowing a ceramic precursor into a reactor containing the polymer body.

A further embodiment of any of the foregoing methods of forming a component, wherein plasma-enhanced atomic layer deposition comprises purging the reactor.

A further embodiment of any of the foregoing methods of forming a component, wherein plasma-enhanced atomic layer deposition comprises exposing the polymer body to a plasma mixture.

A further embodiment of any of the foregoing methods of forming a component, wherein plasma-enhanced atomic layer deposition comprises ventilating the reactor.

A further embodiment of any of the foregoing methods of forming a component, wherein purging the reactor has a duration of at least 10 seconds and exposing the polymer body has a duration of at least 10 seconds.

A further embodiment of any of the foregoing methods of forming a component, further comprising metallizing the first surface of the polymer body.

A further embodiment of any of the foregoing methods of forming a component, further comprising metallizing the second surface of the polymer body.

A further embodiment of any of the foregoing methods of forming a component, wherein metallizing the first surface of the polymer body comprises using vacuum deposition to deposit one or more layers of a metal on the first surface of the polymer body.

A further embodiment of any of the foregoing methods of forming a component, wherein metallizing the second surface of the polymer body comprises using vacuum deposition to deposit one or more layers of a metal on the second surface of the polymer body A further embodiment of any of the foregoing methods of forming a component, wherein depositing the ceramic material is performed in a vacuum condition.

A further embodiment of any of the foregoing methods of forming a component, wherein the open-cell void of the polymer body is created by etching an etchable material away from the polymer body.

A further embodiment of any of the foregoing methods of forming a component, wherein the etchable material is polyimide.

A further embodiment of any of the foregoing methods of forming a component, wherein the polymer body is formed of a polyaryl ethyl ketone material.

A further embodiment of any of the foregoing methods of forming a component, wherein etching comprises leaching the polyimide away from the polymer body.

A method of forming a plate and frame heat exchanger comprising forming a plurality of heat-exchanging plates according to any of the foregoing methods of forming a component and attaching the plurality of heat-exchanging plates to a heat exchanger housing.

The method of forming a plate and frame heat exchanger of the preceding paragraph can optionally include, additionally and/or alternatively, any one or more of the following steps, features, configurations and/or additional components:

A further embodiment of any of the foregoing methods of method of forming a plate and frame heat exchanger, further comprising attaching the plurality of heat-exchanging plates to a heat exchanger housing.

A further embodiment of any of the foregoing methods of method of forming a plate and frame heat exchanger, wherein the plurality of plates are arranged to define a first flowpath of a first fluid.

A further embodiment of any of the foregoing methods of method of forming a plate and frame heat exchanger, wherein the plurality of plates are arranged to define a second flowpath of a second fluid.

A further embodiment of any of the foregoing methods of method of forming a plate and frame heat exchanger, wherein the first flowpath and second flowpath are separated by the plurality of plates.

A further embodiment of any of the foregoing methods of method of forming a plate and frame heat exchanger, wherein each of the plurality of heat-exchanging plates is contact with both the first flowpath and the second flowpath.

A further embodiment of any of the foregoing methods of method of forming a plate and frame heat exchanger, wherein the first flowpath and second flowpath are oriented in a crossflow arrangement.

A further embodiment of any of the foregoing methods of method of forming a plate and frame heat exchanger, wherein the first flowpath and second flowpath are oriented in a counter flow arrangement.

A further embodiment of any of the foregoing methods of method of forming a plate and frame heat exchanger, wherein the first flowpath and second flowpath are oriented in a cocurrent flow arrangement.

A further embodiment of any of the foregoing methods of method of forming a plate and frame heat exchanger, wherein the first flowpath and second flowpath are oriented in a hybrid flow arrangement.

A further embodiment of any of the foregoing methods of method of forming a plate and frame heat exchanger, wherein the first fluid is an oil.

A further embodiment of any of the foregoing methods of method of forming a plate and frame heat exchanger, wherein the second fluid is a fuel.

A further embodiment of any of the foregoing methods of method of forming a plate and frame heat exchanger, further comprising attaching a plurality of inserts within the first flowpath for creating turbulent flow conditions.

A further embodiment of any of the foregoing methods of method of forming a plate and frame heat exchanger, further comprising attaching a plurality of inserts within the second flowpath for creating turbulent flow conditions.

A further embodiment of any of the foregoing methods of method of forming a plate and frame heat exchanger, wherein attaching the plurality of heat-exchanging plates to the heat exchanger housing comprises friction welding the plurality of heat-exchanging plates to the heat exchanger housing.

A heat-exchanging plate comprising a polymer plate containing a network of open-cell voids, a ceramic material disposed within the network of open-cell voids, the ceramic material circumscribing an open volume, and a sealant disposed within the open volume.

The heat-exchanging plate of the preceding paragraph can optionally include, additionally and/or alternatively, any one or more of the following features, configurations and/or additional components:

A further embodiment of any of the foregoing heat-exchanging plates, wherein the network of open-cell voids extends from a first heat-exchanging surface of the polymer plate to a second heat-exchanging surface of the polymer plate.

A further embodiment of any of the foregoing heat-exchanging plates, wherein the ceramic material forms a plurality of thermally-conductive paths that extend from the first heat-exchanging surface to the second heat-exchanging surface.

A further embodiment of any of the foregoing heat-exchanging plates, wherein each of the plurality of thermally-conductive paths defines the open volume circumscribed by the ceramic material extending along the entire length of the each of the plurality of thermally-conductive paths.

A further embodiment of any of the foregoing heat-exchanging plates, wherein the sealant fills the open volume to prevent fluid communication between the first heat-exchanging surface and the second heat-exchanging surface.

A further embodiment of any of the foregoing heat-exchanging plates, wherein the first heat-exchanging surface is metallized.

A further embodiment of any of the foregoing heat-exchanging plates, wherein the second heat-exchanging surface is metallized.

A further embodiment of any of the foregoing heat-exchanging plates, wherein the sealant is aluminum.

A further embodiment of any of the foregoing heat-exchanging plates, wherein the sealant is copper.

A further embodiment of any of the foregoing heat-exchanging plates, wherein the sealant is a flexible sealant.

A further embodiment of any of the foregoing heat-exchanging plates, wherein the ceramic material is boron nitride.

A further embodiment of any of the foregoing heat-exchanging plates, wherein the ceramic material is aluminum nitride A further embodiment of any of the foregoing heat-exchanging plates, wherein the ceramic material is a combination of boron nitride and aluminum nitride.

A further embodiment of any of the foregoing heat-exchanging plates, wherein the polymer plate is formed of a thermoplastic material.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:
1. A heat-exchanging plate comprising:
  a polymer plate containing a network of open-cell voids, wherein the network of open-cell voids extends from a first heat-exchanging surface of the polymer plate to a second heat-exchanging surface of the polymer plate;
  a ceramic material disposed about a peripheral boundary of each of the open-cell voids, the ceramic material forming a plurality of thermally-conductive paths, wherein each of the plurality of thermally-conductive paths has a uniform thickness measured from the peripheral boundary of one of the voids and extends from the first heat-exchanging surface to the second heat-exchanging surface, and wherein each of the plurality of thermally-conductive paths defines an open volume circumscribed by the ceramic material extending along the entire length of the each of the plurality of thermally-conductive paths, wherein the ceramic material is one or more of boron nitride, aluminum nitride, and silicon carbide; and
  a sealant disposed within the open volume and circumscribed by the ceramic material, wherein the sealant completely fills the open volume to prevent fluid communication between the first heat-exchanging surface and the second heat-exchanging surface and the sealant is aluminum, copper, or a silicon-based sealant.

2. The heat-exchanging plate of claim 1, wherein the first heat-exchanging surface and the second heat-exchanging are metallized.

3. The heat-exchanging plate of claim 1, wherein the polymer plate is formed of a thermoplastic material.

4. A method of forming a heat-exchanging plate comprising:
  providing a polymer plate containing a network of open-cell voids, wherein the network of open-cell voids extends from a first heat-exchanging surface of the polymer plate to a second heat-exchanging surface of the polymer plate;
  depositing a ceramic material within a network of open-cell voids, the ceramic material forming a plurality of thermally-conductive paths from the first heat-exchanging surface of the polymer plate to the second heat-exchanging surface of the polymer plate, wherein the ceramic material is one or more of boron nitride, aluminum nitride, and silicon carbide and depositing the ceramic material comprises:
    depositing the ceramic material around the periphery of each of the thermally-conductive paths using atomic layer deposition to form an open volume circumscribed by the ceramic material that extends along the entire length of the each of plurality of thermally-conductive paths, wherein each of the plurality of thermally-conductive paths has a uniform thickness measured from the peripheral boundary of one of the voids and extends from the first heat-exchanging surface to the second heat-exchanging surface; and
  filling the open volume completely with a sealant and thereby preventing fluid communication between the first heat-exchanging surface and the second heat-exchanging surface, the sealant circumscribed by the ceramic material and wherein the sealant is aluminum, copper, or a silicon-based sealant.

5. The method of claim 4, wherein atomic layer deposition is plasma-enhanced atomic layer deposition.

6. The method of claim 5, wherein plasma-enhanced atomic layer deposition is performed in a reactor held at a temperature between 250° C. and 280° C.

7. The method of claim 5, wherein plasma-enhanced atomic layer deposition comprises:
  flowing a ceramic precursor into a reactor containing the polymer plate;

purging the reactor;

exposing the polymer plate to a plasma mixture; and ventilating the reactor.

8. The method of claim 7, wherein purging the reactor has a duration of at least 10 seconds and exposing the polymer body has a duration of at least 10 seconds.

9. The method of claim 4, further comprising metallizing the first and second heat-exchanging surfaces of the polymer plate.

10. The method of claim 9, wherein metallizing the first and second heat-exchanging surfaces of the polymer body comprises using vacuum deposition to deposit one or more layers of a metal on the first and second heat-exchanging surfaces of the polymer plate.

11. The method of claim 4, wherein depositing the ceramic material is performed in a vacuum condition.

12. The method of claim 4, wherein the open-cell void of the polymer plate is created by etching an etchable material away from the polymer plate.

13. The method of claim 12, wherein the etchable material is polyimide, the polymer plate is formed of a polyaryl ethyl ketone material, and etching comprises leaching the polyimide away from the polymer plate.

14. A method of forming a plate and frame heat exchanger comprising:

forming a plurality of heat-exchanging plates according to the method of claim 4; and attaching the plurality of heat-exchanging plates to a heat exchanger housing, the plurality of plates arranged to define a first flowpath of a first fluid and a second flowpath of a second fluid, wherein the first flowpath and second flowpath are separated by the plurality of plates and each of the plurality of heat-exchanging plates is contact with both the first flowpath and the second flowpath.

15. The method of claim 14, wherein the first flowpath and second flowpath are oriented in a crossflow arrangement, a counter flow arrangement, a cocurrent flow arrangement, or a hybrid flow arrangement.

16. The method of claim 14, wherein the first fluid is an oil and the second fluid is a fuel.

17. The method of claim 14, further comprising attaching a plurality of inserts within the first flowpath and second flowpath for creating turbulent flow conditions.

18. The method of claim 14, wherein attaching the plurality of heat-exchanging plates to the heat exchanger housing comprises friction welding the plurality of heat-exchanging plates to the heat exchanger housing.

* * * * *